(12) United States Patent
Xing et al.

(10) Patent No.: US 11,500,047 B2
(45) Date of Patent: Nov. 15, 2022

(54) POWER CONTROL APPARATUS FOR RADIO-FREQUENCY POWER AMPLIFIER AND RADIO-FREQUENCY TRANSMISSION SYSTEM FOR MRI SYSTEM

(71) Applicant: GE Precision Healthcare LLC, Wauwatosa, WI (US)

(72) Inventors: Haoyang Xing, Beijing (CN); Haotian Jiang, Beijing (CN); Xuelian Lu, Beijing (CN); Sheng Tong, Beijing (CN); Yu Liu, Beijing (CN); Hai Huang, Beijing (CN)

(73) Assignee: GE Precision Healthcare LLC, Wauwatosa, WI (US)

( * ) Notice: Subject to any disclaimer, the term of this patent is extended or adjusted under 35 U.S.C. 154(b) by 0 days.

(21) Appl. No.: 17/304,346

(22) Filed: Jun. 18, 2021

(65) Prior Publication Data
US 2021/0396822 A1 Dec. 23, 2021

(30) Foreign Application Priority Data
Jun. 23, 2020 (CN) .......................... 202010582555.7

(51) Int. Cl.
*G01R 33/36* (2006.01)
(52) U.S. Cl.
CPC ..... *G01R 33/3614* (2013.01); *G01R 33/3692* (2013.01)

(58) Field of Classification Search
CPC .................. G01R 33/3614; G01R 33/3692
See application file for complete search history.

(56) References Cited

U.S. PATENT DOCUMENTS

| 6,008,698 A * | 12/1999 | Dacus | H03G 3/004 330/285 |
| 6,104,241 A | 8/2000 | Cova | |
| 2008/0079488 A1* | 4/2008 | Albrecht | H03F 1/0238 455/127.2 |
| 2014/0152390 A1* | 6/2014 | McMorrow | H03F 1/0277 330/296 |

FOREIGN PATENT DOCUMENTS

WO WO-2012114217 A1 * 8/2012 ......... G01R 33/3614

* cited by examiner

*Primary Examiner* — G. M. A. Hyder

(57) ABSTRACT

Provided in the present invention are a power control apparatus for a radio-frequency power amplifier and a radio-frequency transmission system for a magnetic resonance imaging system. The power control apparatus comprises: a power control module used to receive a control voltage so as to control an output power of the radio-frequency power amplifier; a voltage detection module used to detect an operating voltage provided to the radio-frequency power amplifier and to output a detected voltage; and a voltage adjustment module used to adjust, on the basis of the detected voltage, the control voltage received by the power control module so as to adjust the output power of the radio-frequency power amplifier.

10 Claims, 8 Drawing Sheets

POWER CONTROL APPARATUS FOR RADIO-FREQUENCY POWER AMPLIFIER AND RADIO-FREQUENCY TRANSMISSION SYSTEM FOR MRI SYSTEM

CROSS-REFERENCE TO RELATED APPLICATIONS

This application claims priority pursuant to 35 U.S.C. 119(a) to China Patent Application No. 202010582555.7 filed on Jun. 23, 2020, the disclosure of which is herein incorporated by reference in its entirety.

TECHNICAL FIELD

The present invention generally relates to the field of medical imaging, and more specifically, relates to a power control apparatus for a radio-frequency power amplifier and a radio-frequency transmission system for a magnetic resonance imaging (MRI) system.

BACKGROUND

Magnetic resonance imaging systems have been widely used in the field of medical diagnosis. A magnetic resonance imaging system mainly comprises a main magnet, a gradient field system, an RF transmit chain, an RF transmitting coil assembly, and an RF receive chain. The RF transmit chain generally comprises an RF generator and a radio-frequency power amplifier assembly. An RF pulse signal is generated by the RF generator, and is then transmitted to a radio-frequency transmitting coil after being amplified by an RF amplifier. In response to the amplified RF pulse signal, the radio-frequency transmitting coil transmits an RF excitation pulse to an object to be scanned (for example, a patient).

In an imaging process, non-linearity of a radio-frequency chain may cause image quality issues, such as image distortion. Therefore, improving the linearity of a radio-frequency chain is of interest to those skilled in the art.

SUMMARY

The objective of the present invention is to overcome the above and/or other problems in the prior art.

An embodiment of the present invention provides a power control apparatus for a radio-frequency power amplifier, comprising:
  a power control module used to receive a control voltage so as to control an output power of the radio-frequency power amplifier;
  a voltage detection module used to detect an operating voltage provided to the radio-frequency power amplifier and to output a detected voltage; and
  a voltage adjustment module used to adjust, on the basis of the detected voltage, the control voltage received by the power control module so as to adjust the output power of the radio-frequency power amplifier.

Optionally, the voltage adjustment module comprises a voltage conversion unit and an adjustable voltage generation unit. The voltage conversion unit is used to receive an adjustable reference voltage generated by the adjustable voltage generation unit and to convert the detected voltage to the control voltage on the basis of the adjustable reference voltage.

Optionally, the voltage conversion unit comprises a first conversion unit and a second conversion unit. The first conversion unit is used to scale the detected voltage down to a first voltage according to a preset ratio. The second conversion unit is used to convert the first voltage to the control voltage on the basis of the adjustable reference voltage.

Optionally, the first conversion unit comprises a proportional amplifier.

Optionally, the second conversion unit comprises a reference voltage end, an input end, and an output end. The reference voltage end of the second conversion unit is used to receive the adjustable reference voltage from the adjustable voltage generation module. The input end of the second conversion unit is used to receive the first voltage. The output end of the second conversion unit is used to perform an operation on the first voltage and the adjustable reference voltage and then output the control voltage.

Optionally, the power control module comprises a variable voltage attenuator. The second conversion unit comprises an inverter circuit and an adder circuit. The inverter circuit is used to convert the first voltage to a negative voltage. The adder circuit is used to add the negative voltage and the adjustable reference voltage so as to generate the control voltage.

Optionally, the power control module comprises a voltage gain amplifier. The second conversion circuit comprises a subtractor circuit. The subtractor circuit is used to perform a subtraction operation on the first voltage and the adjustable reference voltage so as to generate the control voltage.

Optionally, the adjustable reference voltage is determined on the basis of a drop value between the operating voltage of the radio-frequency power amplifier and a desired operating voltage.

Optionally, the power control module is used to receive a first radio-frequency power signal and to attenuate the first radio-frequency power signal on the basis of the control voltage so as to output a second radio-frequency power signal to the radio-frequency power amplifier. The radio-frequency power amplifier is used to amplify the second radio-frequency signal.

Another embodiment of the present invention further provides a radio-frequency transmission system for a magnetic resonance imaging system, comprising:
  a radio-frequency signal generator used to transmit a radio-frequency power signal;
  a power control module used to receive the radio-frequency power signal and to attenuate the radio-frequency power signal on the basis of a control voltage thereof so as to output an attenuated radio-frequency power signal;
  a radio-frequency power amplifier used to amplify the attenuated radio-frequency power signal so as to output a high-power radio-frequency signal; and
  a voltage adjustment module used to adjust, on the basis of a change in an operating voltage of the radio-frequency power amplifier, the control voltage received by the power control module so as to adjust the high-power radio-frequency signal.

Other features and aspects will become clear through the following detailed description, accompanying drawings and claims.

BRIEF DESCRIPTION OF THE DRAWINGS

The present invention may be better understood by describing exemplary embodiments of the present invention with reference to accompanying drawings, in which.

DETAILED DESCRIPTION OF THE INVENTION

Specific implementations of the present invention will be described in the following. It should be noted that during the specific description of the implementations, it is impossible to describe all features of the actual implementations in detail in this description for the sake of brief description. It should be understood that in the actual implementation of any of the implementations, as in the process of any engineering project or design project, a variety of specific decisions are often made in order to achieve the developer's specific objectives and meet system-related or business-related restrictions, which will vary from one implementation to another. Moreover, it can also be understood that although the efforts made in such development process may be complex and lengthy, for those of ordinary skill in the art related to content disclosed in the present invention, some changes in design, manufacturing, production or the like based on the technical content disclosed in the present disclosure are only conventional technical means, and should not be construed as that the content of the present disclosure is insufficient.

Unless otherwise defined, the technical or scientific terms used in the claims and the description are as they are usually understood by those of ordinary skill in the art to which the present invention pertains. The terms "first," "second," and similar terms used in the description and claims of the patent application of the present invention do not denote any order, quantity or importance, but are merely intended to distinguish between different constituents. "One," "a(n)," and similar terms are not meant to be limiting, but rather denote the presence of at least one. The term "include," "comprise," or a similar term is intended to mean that an element or article that appears before "include" or "comprise" encompasses an element or article and equivalent elements that are listed after "include" or "comprise," and does not exclude other elements or articles. The term "connect," "connected," or a similar term is not limited to a physical or mechanical connection, and is not limited to a direct or indirect connection.

Figure 1:
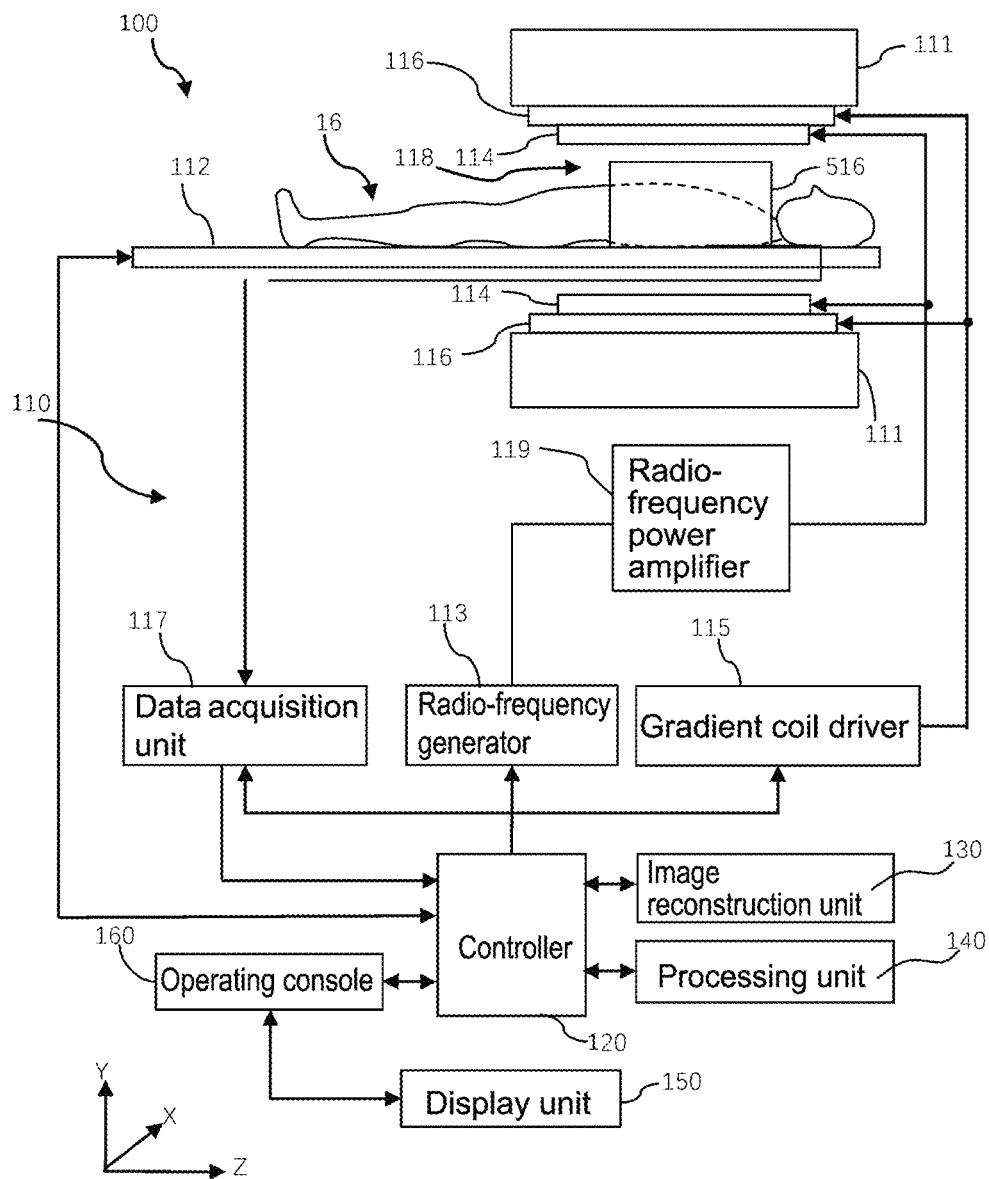
FIG. 1 shows a schematic structural diagram of a magnetic resonance imaging system according to an embodiment.

FIG. 1 shows a schematic structural diagram of a magnetic resonance imaging (MM) system according to an embodiment. The magnetic resonance imaging system 100 includes a scanner 110. The scanner 110 is used to perform magnetic resonance scanning on an object 16 (for example, a human body) to generate image data of a region of interest of the object 16, and the region of interest may be a predetermined imaging site or tissue to be imaged.

The magnetic resonance imaging system 100 may further include a controller 120 coupled to the scanner 110 so as to control the scanner 110 to perform the aforementioned magnetic resonance scan process. Specifically, the controller 120 may send a sequence control signal to relevant components (such as a radio-frequency generator and a gradient coil driver that will be described below) of the scanner 110 by means of a sequence generator (not shown in the drawing), so that the scanner 110 performs a preset scan sequence.

Those skilled in the art could understand that the "scan sequence" refers to a combination of pulses having specific amplitudes, widths, directions, and time sequences and applied when a magnetic resonance imaging scan is performed. The pulses may usually include, for example, radio-frequency pulses and gradient pulses. The radio-frequency pulses may include, for example, a radio-frequency transmit pulse for exciting protons in the body to resonate. The gradient pulses may include, for example, a slice selection gradient pulse, a phase encoding gradient pulse, a frequency encoding gradient pulse, etc. Generally, a plurality of scan sequences may be preset in the magnetic resonance system, so that a sequence corresponding to clinical test requirements can be selected. The clinical test requirements may include, for example, a part to be imaged, an imaging function, etc.

In an example, the scanner 110 may include a main magnet assembly 111, a table 112, a radio-frequency generator 113, a radio-frequency transmitting coil 114, a gradient coil driver 115, a gradient coil assembly 116, a radio-frequency power amplifier 119, and a data acquisition unit 117.

The main magnet assembly 111 usually includes an annular superconducting magnet defined in a housing. The annular superconducting magnet is mounted in an annular vacuum container. The annular superconducting magnet and the housing thereof define a cylindrical space surrounding the object 16, such as a scanning chamber 118 shown in FIG. 1. The main magnet assembly 111 generates a constant magnetic field, i.e., a B0 field, in a Z direction of the scanning chamber 118. Typically, a uniform portion of the B0 field is formed in a central region of the main magnet.

The table 112 is configured to carry the object 16, and travel in the Z direction to enter or exit the scanning chamber 118 in response to the control of the controller 120. For example, in an embodiment, an imaging volume of the object 16 may be positioned at a central region of the scanning chamber with uniform magnetic field strength so as to facilitate scanning imaging of the imaging volume of the object 16.

The magnetic resonance imaging system 100 uses the formed B0 field to transmit a static magnetic pulse signal to the object 16 located in the scanning chamber, so that protons in resonant volumes in the body of the object 16 precess in an ordered manner to generate a longitudinal magnetization vector.

The radio-frequency generator 113 and the radio-frequency power amplifier 119 may be used as part of a radio-frequency transmit chain. The radio-frequency generator 113 is used to generate a radio-frequency pulse in response to a control signal of the controller 120. The radio-frequency pulse is usually a small radio-frequency signal having low power. The small radio-frequency signal may be amplified by the radio-frequency power amplifier 119, and then applied to the radio-frequency transmitting coil 114. In an embodiment, a signal transmission module is further included between the radio-frequency generator 113 and the radio-frequency power amplifier. The signal transmission module may comprise, for example, a radio-frequency attenuation controller. The aforementioned small radio-frequency signal can be attenuated by the radio-frequency attenuation controller, and then amplified by the radio-frequency power amplifier. The aforementioned radio-frequency pulse may include, for example, a radio-frequency excitation pulse. The radio-frequency transmitting coil 114 may include, for example, a body coil usually disposed along an inner circumference of the main magnet, or a head coil dedicated to head imaging. The radio-frequency transmitting coil 114 may be connected to a transmit/receive (T/R) switch. By controlling the transmit/receive switch, the body coil can be switched between a transmit mode and a receive mode. In the transmit mode, the radio-frequency transmitting coil 114 is used, in response to the aforementioned radio-frequency excitation pulse, to transmit to the object 16 a radio-frequency field B1 orthogonal to the static magnetic field B0, so as to excite nuclei in the body of the object 16, so that a longitudinal magnetization vector is converted into a transverse magnetization vector. In the receive mode, the body coil may be used to receive a magnetic resonance signal from the object 16.

After the end of the radio-frequency excitation pulse, a free induction decay signal, namely, a magnetic resonance signal that can be acquired, is generated in the process that the transverse magnetization vector of the object 16 is gradually restored to zero.

The gradient coil driver 115 is configured to provide a suitable current/power to the gradient coil assembly 116 in response to a gradient pulse control signal or a shimming control signal sent by the controller 120.

The gradient coil assembly 116, on one hand, forms a varying magnetic field in an imaging space so as to provide three-dimensional position information for the magnetic resonance signal, and on the other hand, generates a compensating magnetic field of the B0 field to shim the B0 field.

The gradient coil assembly 116 may include three gradient coils. The three gradient coils are respectively configured to generate magnetic field gradients inclined to three spatial axes (for example, the X-axis, Y-axis, and Z-axis) perpendicular to each other. More specifically, the gradient coil assembly 116 applies a magnetic field gradient in a slice selection direction (such as the Z direction) so as to select a layer in the imaging volume. Those skilled in the art will understand that the layer is any one of a plurality of two-dimensional slices distributed in the Z direction in the three-dimensional imaging volume. The aforementioned "Z-direction" is generally a direction extending from the head to the feet when a patient is positioned on the table 112. When scanning is performed for the imaging, the radio-frequency transmitting coil 114 transmits a radio-frequency excitation pulse to the layer of the imaging volume and excites the layer. The gradient coil assembly 116 applies a magnetic field gradient in a phase encoding direction (such as the Y direction) so as to perform phase encoding on a magnetic resonance signal of the excited layer. The gradient coil assembly 116 applies a gradient field in a frequency encoding direction (such as the X direction) of the object 16 so as to perform frequency encoding on the magnetic resonance signal of the excited layer.

The data acquisition unit 117 is configured to acquire the magnetic resonance signal (for example, received by the body coil or a surface coil) in response to a data acquisition control signal of the controller 120. In an embodiment, the data acquisition unit 117 may include, for example, a radio-frequency preamplifier, a phase detector, and an analog/digital converter, where the radio-frequency preamplifier is configured to amplify the magnetic resonance signal, the phase detector is configured to perform phase detection on the amplified magnetic resonance signal, and the analog/digital converter is configured to convert the phase-detected magnetic resonance signal from an analog signal to a digital signal.

The magnetic resonance imaging system 100 includes an image reconstruction unit 130. The image reconstruction unit 130 can perform reconstruction on a series of two-dimensional slice images, namely, the aforementioned image sequence, of an imaging volume of the object 16 on the basis of the aforementioned digitized magnetic resonance signal. Specifically, the reconstruction unit may perform the aforementioned image reconstruction on the basis of communication with the controller 120.

The magnetic resonance imaging system 100 includes a processing unit 140. The processing unit 140 can perform any required image processing on any image in the aforementioned image sequence, such as correcting an image and determining a display parameter of an image. The aforementioned image processing may be an improvement or adaptive adjustment made to an image in any one of contrast, uniformity, clarity, brightness, and the like. Specifically, the processing unit 140 may perform the aforementioned image processing on the basis of communication with the controller 120.

In an embodiment, the controller 120, the image reconstruction unit 130, and the processing unit 140 may separately or collectively include a computer and a storage medium. The storage medium records a predetermined control program and data processing program to be executed by the computer. For example, the storage medium may store a program used to implement an imaging scan, image reconstruction, image processing, etc. For example, the storage medium may store a program used to implement an image display method according to embodiments of the present invention. The storage medium may include, for example, a ROM, a floppy disk, a hard disk, an optical disk, a magneto-optical disk, a CD-ROM, or a non-volatile memory card.

The magnetic resonance imaging system 100 may include a display unit 150. The display unit 150 may be used to display an operation interface and various data or images generated in the data processing process. The display unit 150 may display the aforementioned sequence images in a certain arrangement manner by means of the display unit 150 in response to a display control signal of the controller 120 (the display control signal may be generated in response to a request operation of a physician for reading the image). For example, the sequence images may be arranged according to the order of slice positions. In addition, the display unit 150 may also communicate with the processing unit 140 (for example, by means of the controller 120) to display the aforementioned sequence images according to display parameters determined by the processing unit 140.

The magnetic resonance imaging system 100 further includes a console 160. The console 160 may include user input devices, such as a keyboard and a mouse. The controller 120 can communicate with the scanner 110, the image reconstruction unit, the processing unit 140, the display unit 150 and the like in response to a control command of a user generated on the basis of the operating console 160 or an operation panel/button disposed on the housing of the main magnet.

For the transmit chain, it is typically desirable to have a stable gain between a radio-frequency power output by the radio-frequency power amplifier and a radio-frequency power generated by a front end (for example, a radio-frequency power generated by the radio-frequency generator and a radio-frequency input power of the radio-frequency power amplifier) so as to ensure the fidelity of radio-frequency signal transmission, thereby avoiding corresponding image quality issues.

Figure 2:
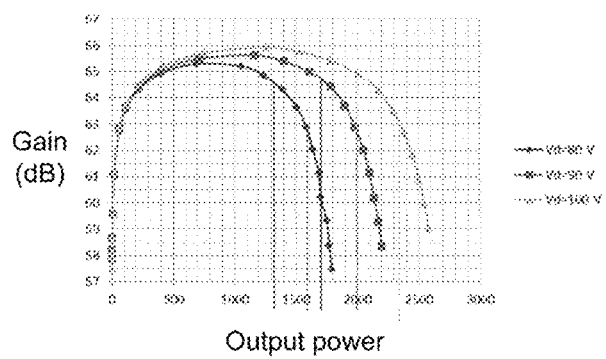
FIG. 2 shows a schematic diagram illustrating a change in a radio-frequency gain due to a change in an operating voltage of a radio-frequency power amplifier in an example.

An operating voltage of the radio-frequency power amplifier is generally provided by a power source. Specifically, a capacitor bank is used to store electrical energy and charge the power source to generate the operating voltage. In the solution of the present invention, it is found by means of experiments that when a signal strength of a transmitted radio-frequency pulse is high, the operating voltage provided to the radio-frequency power amplifier by the power source drops. Analysis reveals that this is because when radio-frequency energy is high, the amount of a current being absorbed is large, resulting in a drop in the operating voltage of the radio-frequency power amplifier. When the operating voltage drops, a gain of the radio-frequency power amplifier also decreases. FIG. 2 shows a schematic diagram illustrating a change in a radio-frequency gain due to a change in the operating voltage of the radio-frequency power amplifier in an example.

Figure 3:
FIG. 3 shows an oscillogram illustrating a drop in the amplitude of a radio-frequency power pulse.

The decrease in the radio-frequency gain results in a reduction in a radio-frequency output power when a radio-frequency input power remains unchanged, resulting in a drop in the amplitude of an output radio-frequency pulse waveform, such as the waveform change shown in FIG. 3, and accordingly affecting the fidelity of the radio-frequency signal transmission.

Figure 4:
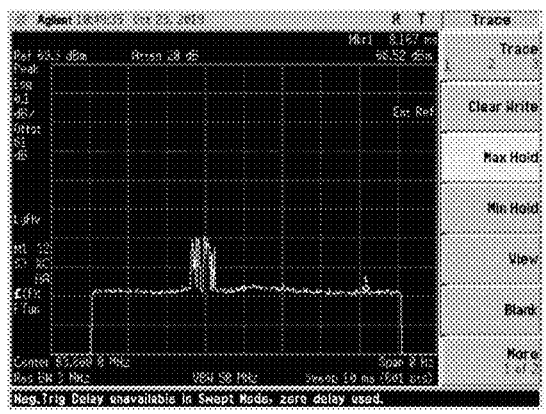
FIG. 4 shows an oscillogram of a radio-frequency power pulse upon occurrence of radio-frequency oscillations.

In the embodiments of the present invention, gain compensation can be used to resolve an issue in which the radio-frequency signal is non-linearly transmitted. Closed-loop gain compensation is one of gain compensation methods. For example, a radio-frequency output signal at an output end is fed back to the radio-frequency transmit chain to adjust control parameters in the chain so as to perform gain compensation. However, a closed-loop gain is limited to a small range of applications. For a large decrease in the gain caused by a large drop in the operating voltage, such compensation is far from sufficient unless expenditures are spent to increase the capacity of the capacitor bank. Alternatively, a loop compensation gain can be increased. However, the increased loop compensation gain results in a reduced envelope bandwidth and oscillations of the radio-frequency signal. An example of such oscillations is shown in FIG. 4. Such oscillations severely affect the stability and the fidelity of radio-frequency signal transmission.

Figure 5:
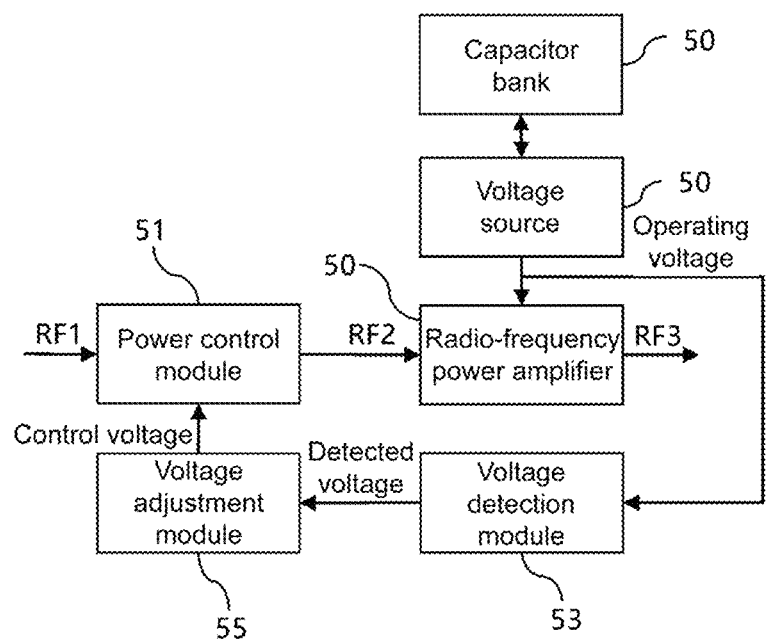
FIG. 5 shows a block diagram of a radio-frequency power control apparatus according to an embodiment of the present invention.

FIG. 5 shows a block diagram of a radio-frequency power control apparatus according to an embodiment of the present invention. As shown in FIG. 5, the radio-frequency power control apparatus includes a power control module 51, a voltage detection module 53, and a voltage adjustment module 55.

The power control module 51 is used to receive a control voltage so as to control an output power of a radio-frequency power amplifier 501 of the magnetic resonance imaging system. As described above, the radio-frequency power amplifier is generally disposed in the radio-frequency transmit chain of the magnetic resonance imaging system, and is used to amplify a low-power radio-frequency signal generated by the front end of the chain so as to output a high-power radio-frequency signal that can excite the radio-frequency transmitting coil. When radio-frequency input signals are consistent, a radio-frequency output power of the radio-frequency power amplifier is determined according to a radio-frequency gain of the radio-frequency transmit chain.

An operating voltage of the radio-frequency power amplifier 501 can be provided by a voltage source 502. Specifically, a capacitor bank 503 is used to charge the voltage source 502, and the charged voltage source 502 provides an operating voltage, for example, a 165 V DC voltage, to the radio-frequency power amplifier 501.

The voltage detection module 53 is used to detect the operating voltage provided to the radio-frequency power amplifier 501 and output the detected voltage. For example, the voltage detection module 53 receives an actual operating voltage from a voltage input end of the radio-frequency power amplifier 501, and outputs the detected operating voltage to a voltage conversion module 55 as the detected voltage. In a case, when the strength of the radio-frequency signal transmitted to the radio-frequency power amplifier 501 is excessively high to cause a large amount of current passing through the radio-frequency power amplifier 501 to be absorbed, the operating voltage of the radio-frequency power amplifier drops, for example, from 165 V to 150 V, and the detected voltage output by the voltage detection module 53 is 150 V.

Those skilled in the art will understand that some magnetic resonance imaging systems may be equipped with a voltage detection and alarm module. The voltage detection and alarm module is used to detect the operating voltage of the radio-frequency power amplifier and issue an alarm signal when the operating voltage is abnormal. In embodiments of the present invention, the operating voltage detected by the voltage detection and alarm module can be directly input to the voltage adjustment module 55 by means of an electrical connection line, thereby avoiding inefficient use of wiring resources. An additional circuit module can also be provided to detect the operating voltage according to design requirements, and the detected operating voltage is input to the voltage adjustment module 55.

The voltage adjustment module 55 is used to adjust, on the basis of the detected voltage, the control voltage received by the power control module 51 so as to adjust the output power of the radio-frequency power amplifier 501.

The voltage adjustment module 55 is used to convert the detected voltage and further adjust the converted voltage to fall within a linear operating range of the power control module 51. For example, the power control module 51 has a characteristic curve. The characteristic curve represents the characteristic of a gain of the power control module 51 changing with the control voltage received by the power control module 51. The characteristic curve has a non-linear operating range and a linear operating range. In the linear operating range, the gain changes linearly with the control voltage.

For example, if a linear operating voltage of the power control module 51 is in the range of −1 V to 1 V, the voltage adjustment module 55 is used to convert the detected voltage (for example, the aforementioned 165 V or 150 V voltage) to a voltage in the range of −1 V to 1 V.

In addition, the voltage adjustment module 55 further adjusts the converted voltage, such that the converted voltage corresponds to a desired operating voltage of the radio-frequency power amplifier 501. For example, if the gain of the radio-frequency transmit chain is an ideal value or a desired value and the operating voltage of the radio-frequency power amplifier 501 is 165 V, the 165 V voltage is considered to be the desired operating voltage, and a control voltage corresponding thereto is 0.5 V. When the operating voltage of the radio-frequency power amplifier 501 drops to 150 V, the control voltage is 0.2 V, and the control voltage can be adjusted from 0.2 V to 0.5 V by means of the voltage adjustment module 55.

In an embodiment, the power control module 51 includes a radio-frequency power attenuator. Those skilled in the art will understand that the radio-frequency power attenuator can be used to pre-amplify (attenuate) a radio-frequency signal at a driver stage to initially adjust a radio-frequency power signal, such that the radio-frequency power signal meets input power requirements at the next stage, for example, input power requirements of the radio-frequency power amplifier, thereby ensuring that the radio-frequency power amplifier outputs a desired radio-frequency power (or a rated power). Specifically, the power control module 51 is used to receive a first radio-frequency power signal RF1, and to attenuate the first radio-frequency power signal on the basis of the control voltage so as to output a second radio-frequency power signal RF2. In an example, the first radio-frequency power signal may be generated by a radio-frequency generator in a radio-frequency transmit chain, and the frequency of the first radio-frequency power signal may be a central frequency for use in magnetic resonance imaging. When different control voltages are input to the power control module 51, the power control module 51 has different attenuation coefficients (or gains), such that different levels of attenuation can be performed on the first radio-frequency power signal, thereby enabling the output second radio-frequency power signals to have different powers.

The radio-frequency power amplifier 501 has a radio-frequency input end and a radio-frequency output end. The radio-frequency input end of the radio-frequency power amplifier 501 is used to receive the second radio-frequency power signal RF2 output by the power control module 51 and to amplify the second radio-frequency power signal, such that the radio-frequency output end outputs an amplified radio-frequency power signal RF3 to excite the radio-frequency transmitting coil.

Thus, in the embodiment of the present invention, when the first radio-frequency power signal remains unchanged, a power of the second radio-frequency power signal can be controlled by adjusting the control voltage input to the power control module so as to adjust the radio-frequency output power of the radio-frequency power amplifier.

Figure 6:
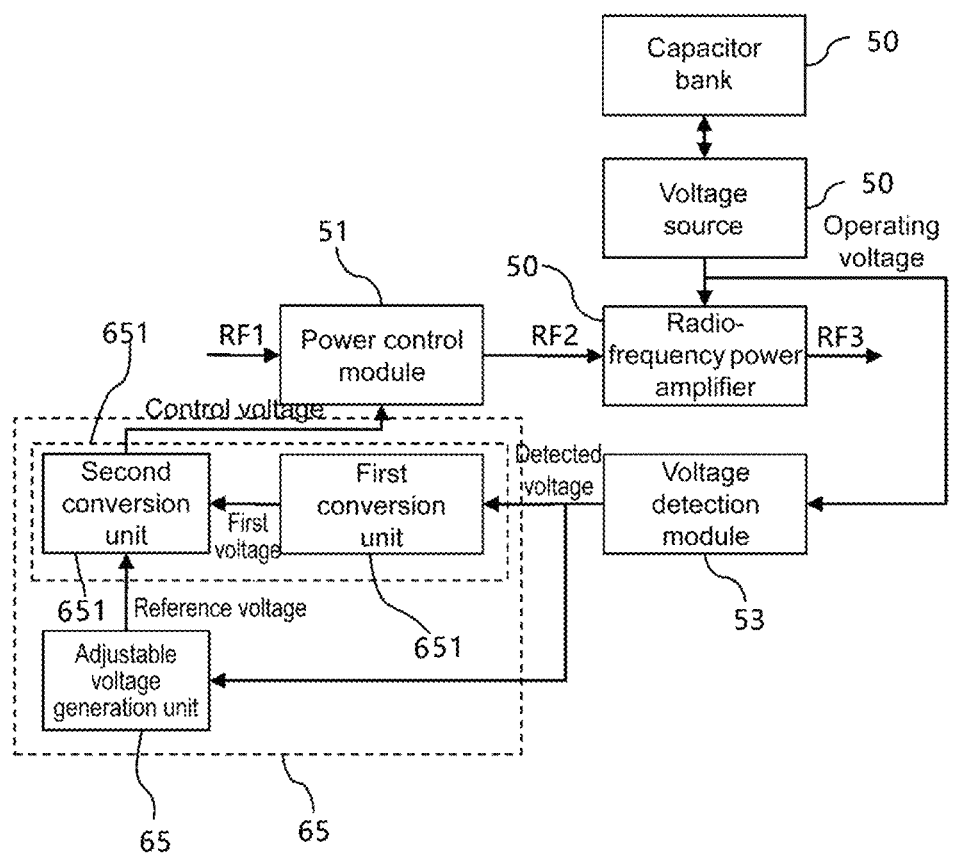
FIG. 6 shows a block diagram of a radio-frequency power control apparatus according to another embodiment of the present invention.

FIG. 6 shows a block diagram of a radio-frequency power control apparatus according to another embodiment of the present invention. The embodiment shown in FIG. 6 is similar to the embodiment shown in FIG. 5 in terms of the principle, the structure, etc., and differs from the embodiment shown in FIG. 5 in that a voltage adjustment module 65 firstly converts the detected voltage to a voltage close to the linear operating voltage of the power control module 51, and then further converts the voltage to a control voltage within the linear operating range of the power control module 51 by means of secondary conversion. In this way, accurate voltage conversion can be achieved using a relatively simple circuit.

In an embodiment, the voltage adjustment module 65 includes a voltage conversion unit 651 and an adjustable voltage generation unit 652. The adjustable voltage generation unit 652 may include an adjustable voltage source, and an output voltage thereof can be adjusted by means of, for example, digital control or an adjustable resistor. The voltage conversion unit 651 is used to receive an adjustable reference voltage generated by the adjustable voltage generation unit 652, and to convert the detected voltage to the control voltage on the basis of the adjustable reference voltage.

Further, for example, the voltage conversion unit 651 includes a first conversion unit 6511 and a second conversion unit 6512, and the first conversion unit 6511 is used to scale the detected voltage down to a first voltage according to a preset ratio. To facilitate understanding of the present invention rather than limiting the present invention, an example of the ratio can be 50:1, that is, when the detected voltage is a rated voltage of 165 V, the first conversion unit converts the detected voltage to a voltage of 3.3 V; when the detected voltage drops to 155 V, the first conversion unit 651 outputs a voltage of 3 V.

In an embodiment, the first conversion unit 6511 may include a single-stage or multi-stage proportional operational amplifier.

The second conversion unit 6512 is used to convert the first voltage to the control voltage on the basis of the adjustable reference voltage. For example, if the linear operating voltage of the power control module is in the range of −1 V to 1 V, the first voltage can be converted to a control voltage in the range from −1 V to 1 V by means of, for example, a single-stage or multi-stage subtractor.

Specifically, the second conversion unit 6512 may include a reference voltage end, an input end, and an output end. The reference voltage end is used to receive the adjustable reference voltage from the adjustable voltage generation module 652. The input end of the second conversion unit 6512 is used to receive the first voltage. The output end of the second conversion unit 6512 is used to perform an operation on the first voltage and the adjustable reference voltage and then output the control voltage.

Figure 7:
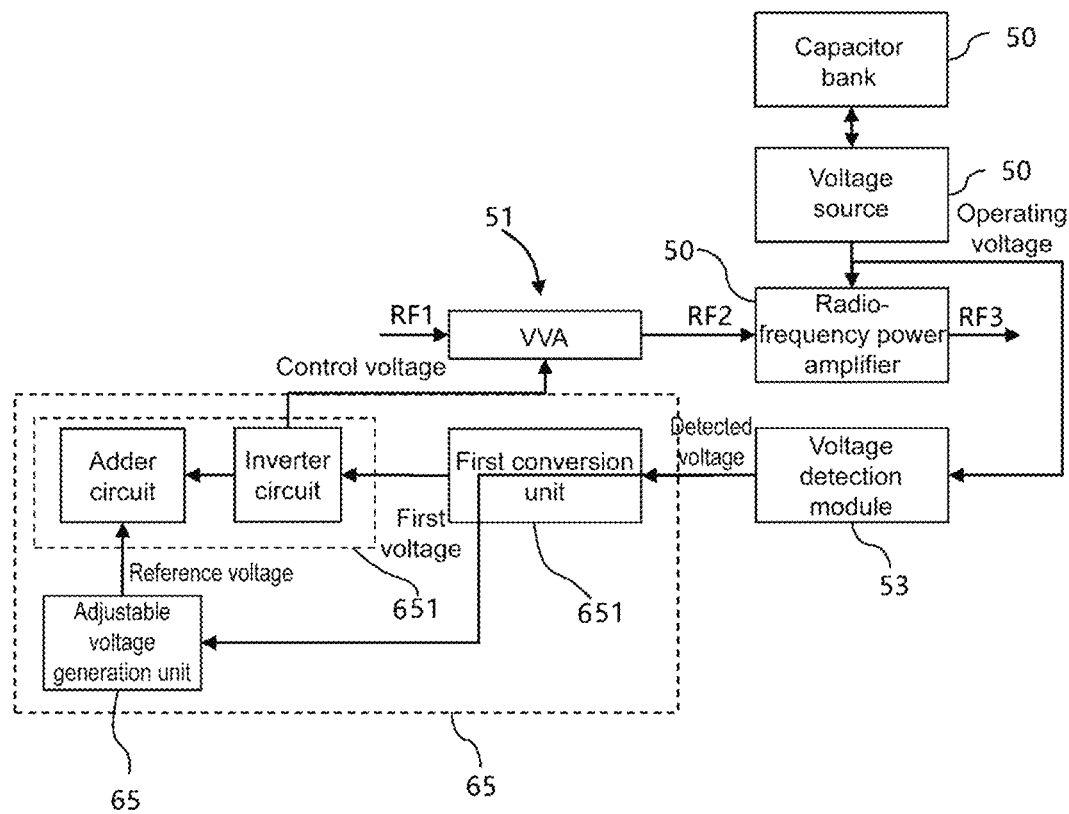
FIG. 7 shows a block diagram of a radio-frequency power control apparatus according to another embodiment of the present invention.

FIG. 7 shows a block diagram of a radio-frequency power control apparatus according to another embodiment of the present invention. As shown in FIG. 7, in this embodiment, the power control module 51 may include a variable voltage attenuator (VVA). The VVA is a commonly used radio-frequency controller. In a linear operating range of the VVA, a gain of the VVA decreases as a control voltage drops, and the control voltage in the linear operating range is usually a negative voltage.

The aforementioned second conversion unit 6512 may include an inverter circuit and an adder circuit. The inverter circuit is used to convert the first voltage output by the first conversion unit 6511 to a negative voltage. The adder circuit is used to add the negative voltage and the adjustable reference voltage to generate the control voltage. For example, when an ideal operating voltage of the radio-frequency power amplifier is 165 V, the first conversion unit

6511 converts the operating voltage to a first voltage of 3.3 V, and the inverter circuit is used to convert the first voltage to a negative voltage of −3.3 V. When the adjustable reference voltage is 2.8 V, an output control voltage is −0.5 V ((−3.3 V)+2.8 V). When the operating voltage of the radio-frequency power amplifier drops to 150 V, the first conversion unit 6511 converts the operating voltage to a first voltage of 3 V, and the inverter circuit converts the first voltage to a negative voltage of −3 V. Accordingly, the control voltage is −0.2 V ((−3 V)+2.8 V). By changing the adjustable reference voltage, the control voltage can be adjusted. For example, if the adjustable reference voltage is adjusted from 2.8 V to 2.5 V, the output control voltage can still be −0.5 V ((−3 V)+2.5 V).

Figure 8:
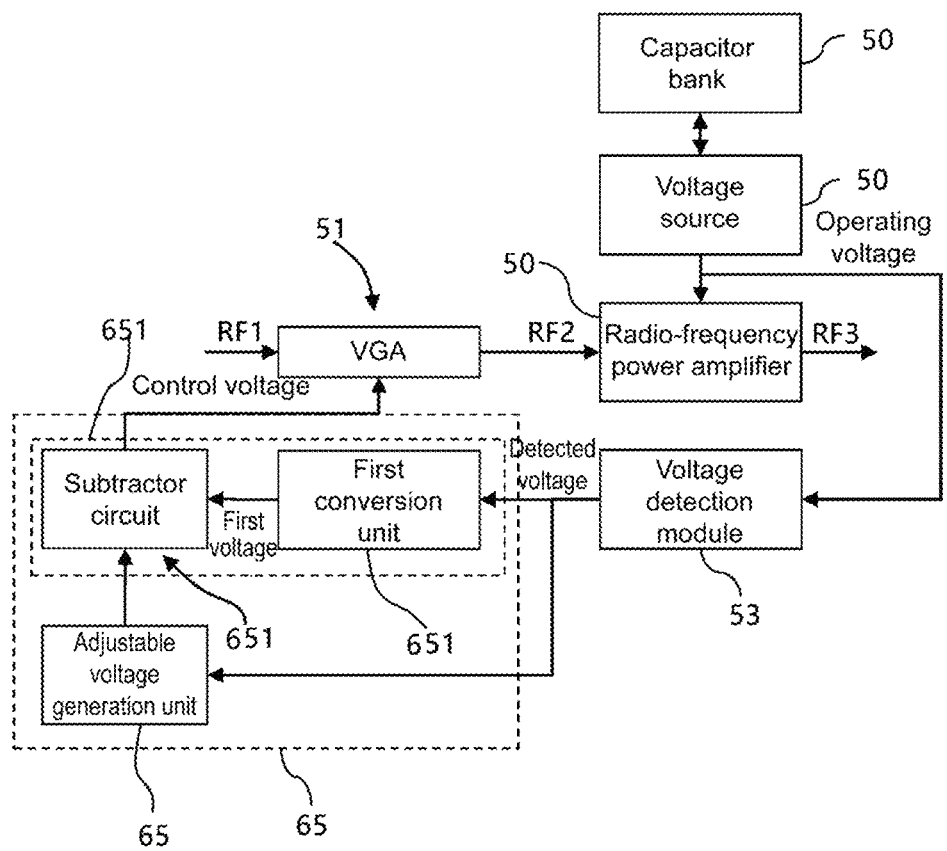
FIG. 8 shows a block diagram of a radio-frequency power control apparatus according to another embodiment of the present invention.

FIG. 8 shows a block diagram of a radio-frequency power control apparatus according to another embodiment of the present invention. As shown in FIG. 8, in this embodiment, the power control module 51 may include a variable gain amplifier (VGA). The VGA is also a commonly used radio-frequency controller. In a linear operating range of the VGA, a gain of the VGA decreases as a control voltage increases, and the control voltage in the linear operating range is usually a positive voltage.

The aforementioned second conversion unit 6512 may include a subtractor circuit, and the subtractor circuit is used to perform a subtraction operation on the first voltage and the adjustable reference voltage so as to generate the control voltage. For example, when the ideal operating voltage of the radio-frequency power amplifier is 165 V, the first conversion unit 6511 converts the operating voltage to 3.3 V, and when the adjustable reference voltage is 2.8 V, an output control voltage is 0.5 V (3.3 V−2.8 V). When the operating voltage of the radio-frequency power amplifier drops to 150 V, the first conversion unit 6511 converts the operating voltage to 3 V, and the control voltage is 0.2 V (3−2.8 V). By changing the adjustable reference voltage, the control voltage can be adjusted. For example, if the adjustable reference voltage is adjusted from 2.8 V to 2.5 V, the output control voltage can still be 0.5 V.

According to the example described above, the adjustable reference voltage is determined on the basis of a drop value between the operating voltage of the radio-frequency power amplifier (or the voltage detected by the voltage detection module 53) and the desired operating voltage.

Figure 9:
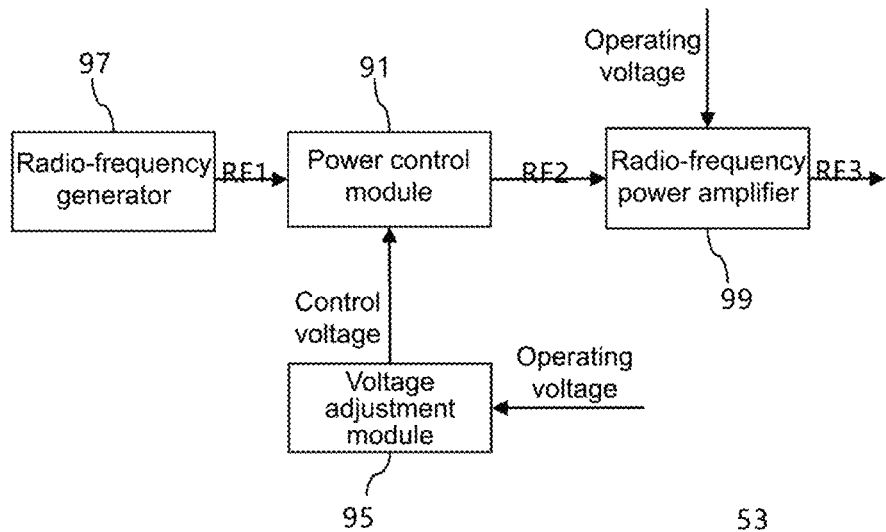
FIG. 9 shows a block diagram of a radio-frequency transmission system for a magnetic resonance imaging system according to an embodiment of the present invention.

As shown in FIG. 9, on the basis of the embodiments described above, another embodiment of the present invention may further provide a radio-frequency transmission system for a magnetic resonance imaging (MIll) system. The radio-frequency transmission system includes a radio-frequency signal generator 97, a power control module 91, a radio-frequency power amplifier 99, and a voltage adjustment module 95.

The radio-frequency generator 97 is used to transmit a radio-frequency power signal, and an operating principle thereof is similar to that of the radio-frequency generator 113 shown in FIG. 1. The power control module 91 is used to receive the radio-frequency power signal, and to attenuate the radio-frequency power signal on the basis of a control voltage thereof so as to output an attenuated radio-frequency power signal. An operating principle and an operating mode of the power control module 91 may be similar to those of the power control module 51 described in any one of the aforementioned embodiments.

The radio-frequency power amplifier 99 is used to amplify the attenuated radio-frequency power signal so as to output a high-power radio-frequency signal. The voltage adjustment module 95 is used to adjust, on the basis of a change in an operating voltage of the radio-frequency power amplifier 99, the control voltage received by the power control module 91 so as to adjust the high-power radio-frequency signal. An operating principle and an operating mode of the voltage adjustment module 95 may be similar to those of the voltage adjustment module 55 or 65 described in any one of the aforementioned embodiments. In a specific embodiment, the voltage adjustment module can obtain the operating voltage of the radio-frequency power amplifier by a variety of means, including obtaining the operating voltage of the radio-frequency power amplifier by means of voltage detection.

In other embodiments, the radio-frequency transmission system of the magnetic resonance imaging (MM) system of the present invention may further include the radio-frequency power control apparatus according to any one of the aforementioned embodiments.

Figure 10:
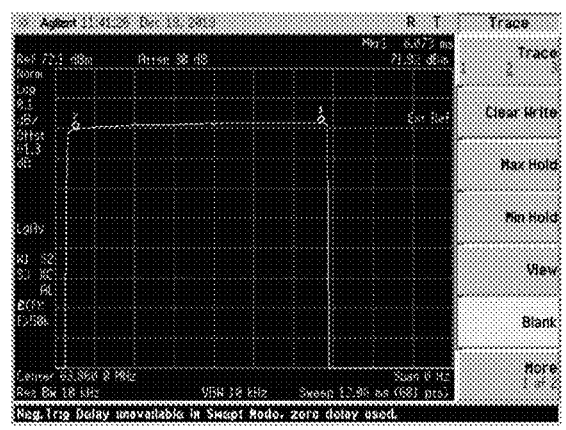
FIG. 10 shows a radio-frequency power pulse waveform obtained after a radio-frequency power control apparatus according to an embodiment of the present invention has been used to adjust an output power of a radio-frequency power amplifier.

FIG. 10 shows a radio-frequency power pulse waveform obtained after the radio-frequency power control apparatus according to an embodiment of the present invention has been used to adjust the output power of the radio-frequency power amplifier. Compared with the waveform corresponding to a reduced power shown in FIG. 3, the embodiment of the present invention can accurately control the radio-frequency power amplifier to output a desired radio-frequency power.

Figure 11:
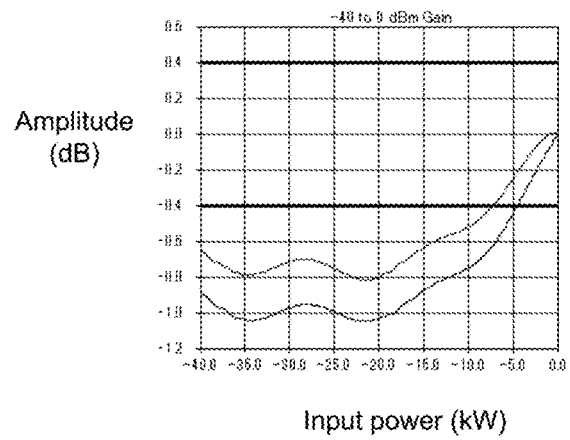
FIG. 11 shows a gain curve of a radio-frequency transmit chain in an existing magnetic resonance imaging system.
Figure 12:
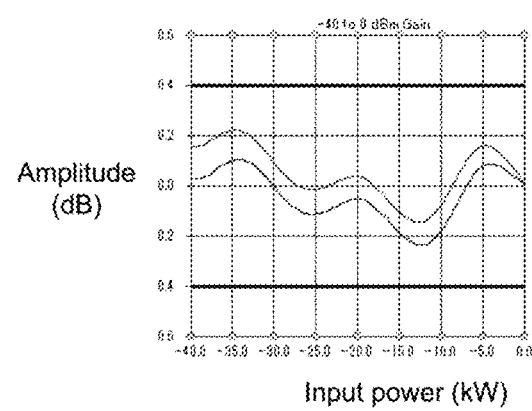
FIG. 12 shows a gain curve of a radio-frequency transmit chain obtained by implementing an embodiment of the present invention.

FIG. 11 shows a gain curve of a radio-frequency transmit chain in an existing magnetic resonance imaging system. FIG. 12 shows a gain curve of a radio-frequency transmit chain obtained by implementing an embodiment of the present invention. By comparing FIG. 11 with FIG. 12, it is clear that the gain curve obtained by implementing the embodiment of the present invention is flatter and has significantly improved linearity.

In the embodiments of the present invention, the control voltage of the radio-frequency control module is adjusted on the basis of a change in the operating voltage of the radio-frequency power amplifier so as to adjust the radio-frequency power output by the radio-frequency power amplifier. A simple structure is used to achieve accurate gain compensation without resulting in any additional issue, thereby avoiding problems such as use of a more costly capacitor bank, and occurrence of radio-frequency oscillations.

Some exemplary embodiments have been described above. However, it should be understood that various modifications can be made. For example, if the described techniques are performed in a different order and/or if the components of the described system, architecture, device, or circuit are combined in other manners and/or replaced or supplemented with additional components or equivalents thereof, a suitable result can be achieved. Accordingly, other implementations also fall within the protection scope of the claims.

The invention claimed is:

1. A power control apparatus for a radio-frequency power amplifier, comprising:
   a power control module used to receive a control voltage so as to control an output power of the radio-frequency power amplifier;
   a voltage detection module used to detect an operating voltage provided to the radio-frequency power amplifier and to output a detected voltage; and
   a voltage adjustment module used to adjust, on the basis of the detected voltage, the control voltage received by the power control module so as to adjust the output power of the radio-frequency power amplifier;

wherein the power control module is used to receive a first radio-frequency power signal and to attenuate the first radio-frequency power signal on the basis of the control voltage so as to output a second radio-frequency power signal to the radio-frequency power amplifier, and the radio-frequency power amplifier is used to amplify the second radio-frequency signal.

2. The apparatus according to claim 1, wherein the voltage adjustment module comprises a voltage conversion unit and an adjustable voltage generation unit, and the voltage conversion unit is used to receive an adjustable reference voltage generated by the adjustable voltage generation unit and to convert the detected voltage to the control voltage on the basis of the adjustable reference voltage.

3. The apparatus according to claim 2, wherein the voltage conversion unit comprises a first conversion unit and a second conversion unit, the first conversion unit is used to scale the detected voltage down to a first voltage according to a preset ratio, and the second conversion unit is used to convert the first voltage to the control voltage on the basis of the adjustable reference voltage.

4. The apparatus according to claim 3, wherein the first conversion unit comprises a proportional amplifier.

5. The apparatus according to claim 3, wherein the second conversion unit comprises a reference voltage end, an input end and an output end, the reference voltage end of the second conversion unit is used to receive the adjustable reference voltage from the adjustable voltage generation module, the input end of the second conversion unit is used to receive the first voltage, and the output end of the second conversion unit is used to perform an operation on the first voltage and the adjustable reference voltage and then output the control voltage.

6. The apparatus according to claim 5, wherein the power control module comprises a variable voltage attenuator, the second conversion unit comprises an inverter circuit and an adder circuit, the inverter circuit is used to convert the first voltage to a negative voltage, and the adder circuit is used to add the negative voltage and the adjustable reference voltage so as to generate the control voltage.

7. The apparatus according to claim 5, wherein the power control module comprises a voltage gain amplifier, and the second conversion circuit comprises a subtractor circuit used to perform a subtraction operation on the first voltage and the adjustable reference voltage so as to generate the control voltage.

8. The apparatus according to claim 3, wherein the adjustable reference voltage is determined on the basis of a drop value between the operating voltage of the radio-frequency power amplifier and a desired operating voltage.

9. A radio-frequency transmission system for a magnetic resonance imaging system, comprising the apparatus according to claim 1.

10. A radio-frequency transmission system for a magnetic resonance imaging system, comprising:
a radio-frequency signal generator used to transmit a radio-frequency power signal;
a power control module used to receive the radio-frequency power signal and to attenuate the radio-frequency power signal on the basis of a control voltage thereof so as to output an attenuated radio-frequency power signal;
a radio-frequency power amplifier used to amplify the attenuated radio-frequency power signal so as to output a high-power radio-frequency signal; and
a voltage adjustment module used to adjust, on the basis of a change in an operating voltage of the radio-frequency power amplifier, the control voltage received by the power control module so as to adjust the high-power radio-frequency signal.

* * * * *